(12) United States Patent
Aizawa

(10) Patent No.: US 10,488,688 B2
(45) Date of Patent: Nov. 26, 2019

(54) DISPLAY DEVICE AND DISPLAY APPARATUS

(71) Applicant: JVC KENWOOD Corporation, Yokohama-shi, Kanagawa (JP)

(72) Inventor: Tadashi Aizawa, Yokohama (JP)

(73) Assignee: JVC KENWOOD CORPORATION, Yokohama-Shi, Kanagawa (JP)

( * ) Notice: Subject to any disclaimer, the term of this patent is extended or adjusted under 35 U.S.C. 154(b) by 0 days.

(21) Appl. No.: 15/939,760

(22) Filed: Mar. 29, 2018

(65) Prior Publication Data

US 2018/0364516 A1    Dec. 20, 2018

(30) Foreign Application Priority Data

Jun. 19, 2017 (JP) ................................ 2017-119411

(51) Int. Cl.
| | |
|---|---|
| *G02F 1/1333* | (2006.01) |
| *H05K 9/00* | (2006.01) |
| *H05K 7/20* | (2006.01) |
| *G03B 21/00* | (2006.01) |
| *G03B 21/16* | (2006.01) |

(52) U.S. Cl.
CPC .. *G02F 1/133308* (2013.01); *G02F 1/133385* (2013.01); *G03B 21/006* (2013.01); *G03B 21/16* (2013.01); *H05K 7/20963* (2013.01); *H05K 9/0054* (2013.01); *G02F 2001/13332* (2013.01)

(58) Field of Classification Search
CPC ......... G02F 1/133308; G02F 1/133385; G02F 2001/1333; G03B 21/16; G03B 21/006; H05K 7/20963; H05K 9/0054
See application file for complete search history.

(56) References Cited

U.S. PATENT DOCUMENTS

2013/0057787 A1\*  3/2013  Aikoh ............... G02F 1/133308
                                                                349/8

FOREIGN PATENT DOCUMENTS

JP           200343442 A    2/2003

\* cited by examiner

*Primary Examiner* — Phu Vu
(74) *Attorney, Agent, or Firm* — Nath, Goldberg & Meyer; Jerald L. Meyer

(57) ABSTRACT

A display device includes a liquid crystal display element, a light shielding member, and a heat sink. The liquid crystal display element has a display pixel region. The light shielding member shields regions other than the display pixel region. The liquid crystal display element and the light shielding member are fixed to the heat sink. The light shielding member includes a frame part, an inclined part, and an opening. The frame part is disposed outside the display pixel region. The inclined part is inclined from the frame part toward an outer peripheral portion of the display pixel region. The opening is formed by an end portion of the inclined part on a side of the display pixel region, and formed in a shape corresponding to the display pixel region.

4 Claims, 11 Drawing Sheets

DISPLAY DEVICE AND DISPLAY APPARATUS

CROSS REFERENCE TO RELATED APPLICATION

This application is based upon and claims the benefit of priority under 35 U.S.C. § 119 from Japanese Patent Application No. 2017-119411, filed on Jun. 19, 2017, the entire contents of which are incorporated herein by reference.

BACKGROUND

The present disclosure relates to a display device and a display apparatus.

Recently, much attention has been paid to a display apparatus such as a projector, which enlarges and projects an image with high contrast using a display device such as a small reflective liquid crystal display device. The display apparatus optically modulates and reflects illumination light irradiated from a light source through the display device, thereby enlarging and projecting an image onto a screen or the like.

In order to enlarge and project an image at high contrast, it is important to lower the black level of the outer peripheral region of a display image. Japanese Unexamined Patent Application Publication No. 2003-43442 discloses that regions other than a display pixel region of a liquid crystal display element constituting the display device are shielded by a light shielding plate.

SUMMARY

When illumination light is irradiated onto the peripheral region of the display pixel region of the liquid crystal display element, unnecessary light such as stray light is generated. The unnecessary light may degrade the display quality of an image, or generate an abnormality such as display unevenness at the outer peripheral portion of the display pixel region. The light shielding member shields the peripheral region of the display pixel region from light irradiated thereto, thereby preventing an occurrence of unnecessary light.

In order to enlarge and project an image with high contrast, high-energy illumination light is irradiated onto the display device. Since the illumination light is also irradiated onto the light shielding member, the temperature of the light shielding member rises. When the temperature of the light shielding member rises, heat generated by the light shielding member is transferred to the liquid crystal display element, thereby degrading the display stability of the liquid crystal display element.

When the light shielding member is isolated from the liquid crystal display element such that the heat of the light shielding member is hardly transferred to the liquid crystal display element, the liquid crystal display element may be easily influenced by the incident angle of illumination light. Since the influence of the incident angle of the illumination light degrades the shielding precision of the light shielding member at the outer peripheral portion of the display pixel region, an image of which the outer peripheral portions are blurred may be displayed.

A first aspect of one or more embodiments provides a display device including a liquid crystal display element including a display pixel region which includes a plurality of pixels for displaying an image and optically modulates illumination light for each of the pixels; a light shielding member configured to block the illumination light irradiated onto regions other than the display pixel region of the liquid crystal display element; and a heat sink to which the liquid crystal display element and the light shielding member are fixed, wherein the light shielding member comprises: a frame part disposed outside the display pixel region; an inclined part inclined from the frame part toward an outer peripheral portion of the display pixel region; and an opening formed by an end portion of the inclined part on a side of the display pixel region, and formed in a shape corresponding to the display pixel region.

A second aspect of one or more embodiments provides a display apparatus including: a light source configured to emit illumination light; and a display device onto which the illumination light is irradiated, wherein the display device includes: a liquid crystal display element including a display pixel region which includes a plurality of pixels for displaying an image and optically modulates the illumination light for each of the pixels; a light shielding member configured to block the illumination light irradiated onto regions other than the display pixel region of the liquid crystal display element; and a heat sink to which the liquid crystal display element and the light shielding member are fixed, and the light shielding member includes: a frame part disposed outside the display pixel region; an inclined part inclined from the frame part toward an outer peripheral portion of the display pixel region; and an opening formed by an end portion of the inclined part on a side of the display pixel region, and formed in a shape corresponding to the display pixel region.

DETAILED DESCRIPTION

First Embodiment

Figure 1:
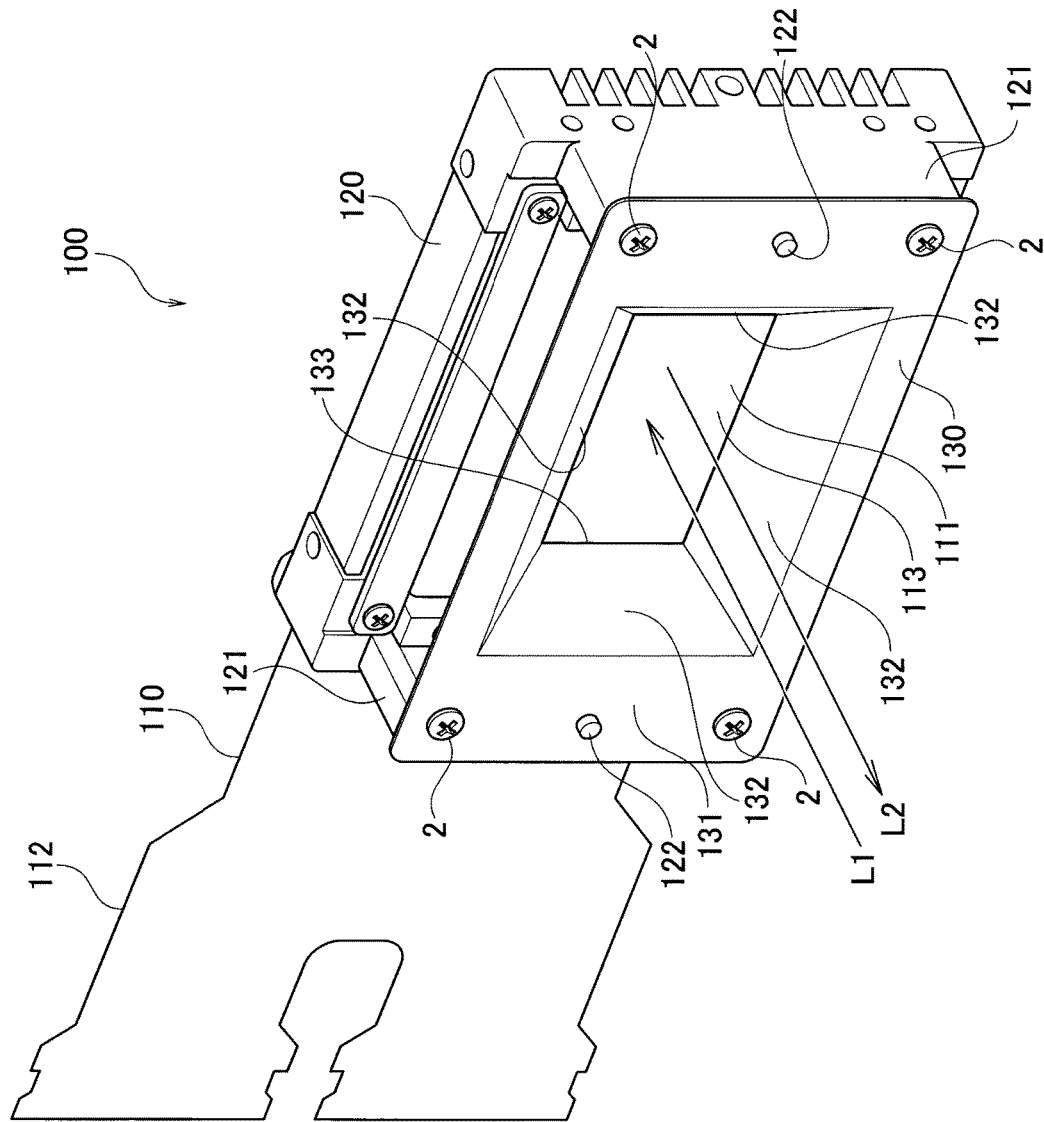
FIG. 1 is a perspective view illustrating a display device according to a first embodiment.
Figure 2:
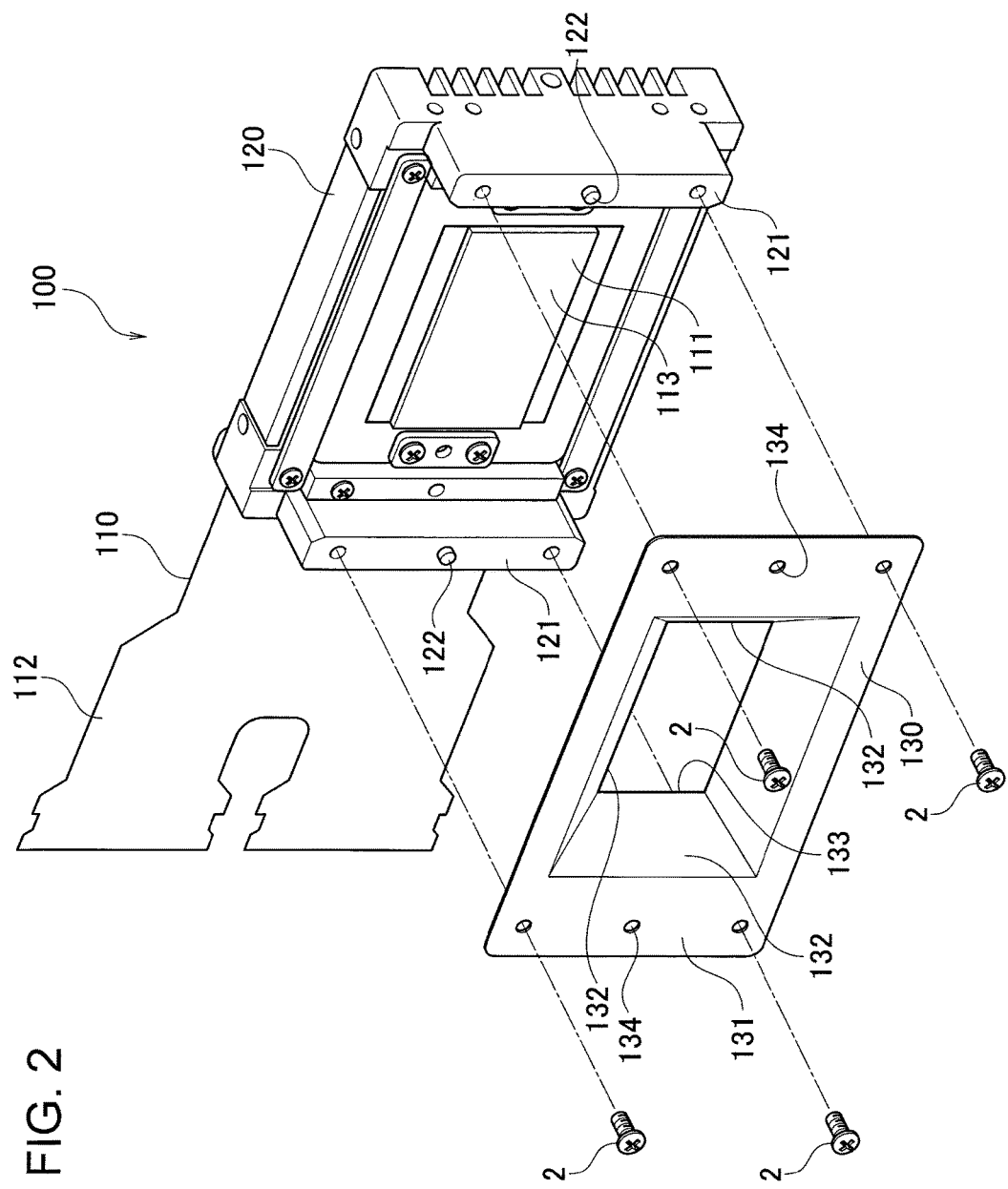
FIG. 2 is an exploded view of the display device according to a first embodiment.
Figure 3:
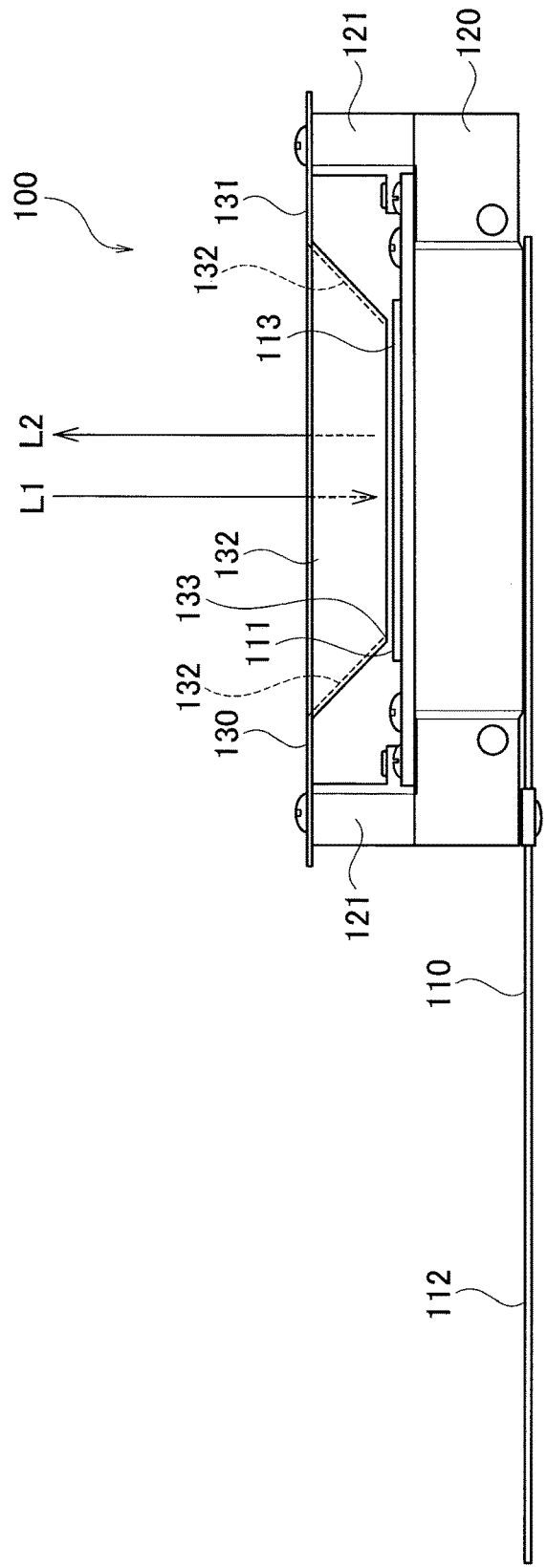
FIG. 3 is a side view of the display device according to a first embodiment.

Referring to FIGS. 1 to 3, a configuration example of a display device 100 according to a first embodiment will be described. In the following descriptions, a reflective liquid crystal display device will be exemplified as the display device 100. FIG. 1 illustrates the display device 100 when seen from a display pixel region 113. FIG. 2 illustrates components of the display device 100 when the display device 100 is disassembled. FIG. 3 illustrates the display device 100 when seen from a side.

As illustrated in FIG. 1, 2, or 3, the display device 100 includes a liquid crystal display unit 110, a heat sink 120, and a light shielding member 130. The liquid crystal display unit 110 includes a liquid crystal display element 111 and a flexible wiring plate 112.

The liquid crystal display element 111 is positioned and fixed to the heat sink 120. The liquid crystal display element 111 includes a display pixel region 113 including a plurality of pixels to display an image. As the liquid crystal display element 111, a liquid-crystal-on-silicon (LCOS) element may be used. The liquid crystal display element 111 and the flexible wiring plate 112 are connected to each other. As the liquid crystal display element 111 is driven through the flexible wiring plate 112 from outside, illumination light L1 irradiated onto the display pixel region 113 is optically modulated and reflected for each pixel, and becomes image light L2.

When the illumination light L1 is irradiated onto the liquid crystal display element 111 or the liquid crystal display element 111 is driven, heat may be generated. The heat is transferred to the heat sink 120. The heat sink 120 discharges the heat transferred from the liquid crystal display element 111 to the outside, thereby preventing a temperature rise of the liquid crystal display element 111. The heat sink 120 includes convex portions 121 to which the light shielding member 130 is fixed. Each of the convex portions 121 includes a cylindrical positioning pin 122 formed thereon.

As the heat sink 120, an aluminum alloy (for example, A6063 (material mark in Japan's JIS standard)) may be used. A6063 represents an aluminum alloy which contains magnesium and silicon. The aluminum alloy A6063 is easily available, and has favorable machinability. The aluminum alloy A6063 has a thermal conductivity of approximately 209 W/(mk).

The light shielding member 130 shields regions other than the display pixel region 113 of the liquid crystal display element 111. Therefore, the illumination light L1 is irradiated onto the display pixel region 113 of the liquid crystal display element 111, and the regions other than the display pixel region 113 are shielded from the illumination light L1 by the light shielding member 130. In order to prevent a generation of unnecessary light by reflection of the illumination light L1, a surface treatment such as coating may be performed such that the light shielding member 130 has a black surface.

As the light shielding member 130, a metal plate formed of stainless steel (for example, SUS304 (material mark in Japan's JIS standard)) may be used. Since the stainless steel has high material strength and the metal plate is available with a thickness of 0.1 mm to 0.05 mm, processing such as cutting, bending, or welding can be easily performed. When SUS304 is used as the material of the light shielding member 130, SUS304 has a thermal conductivity of approximately 16 W/(mk).

The light shielding member 130 includes a frame part 131, four inclined parts 132, and an opening 133. The frame part 131 includes positioning holes 134 formed therein. When the positioning holes 134 and the positioning pins 122 of the heat sink 120 are fitted to each other such that the light shielding member 130 is fastened to the convex portions 121 with screws 2, the light shielding member 130 is positioned and fixed to the heat sink 120. As the liquid crystal display element 111, the light shielding member 130, and the heat sink 120 are aligned with high precision, the opening 133 of the light shielding member 130 and the display pixel region 113 of the liquid crystal display element 111 can be aligned with high precision.

The frame part 131 is disposed outside the display pixel region 113, and is fixed to the convex portions 121 of the heat sink 120. The surface of the frame part 131 is parallel to the surface of the display pixel region 113. However, the present embodiment is not limited to the structure in which the surface of the frame part 131 is parallel to the surface of the display pixel region 113. The height of the convex portion 121 may be designed in such a manner that the frame part 131 is isolated from the liquid crystal display element 111 in order that heat generated by the light shielding member 130 is not easily transferred to the liquid crystal display element 111.

The four inclined parts 132 are formed in a trapezoidal shape, and inclined from the frame part 131 toward the outer peripheral portions of the display pixel region 113. The four inclined parts 132 may be connected to each other as a continuous structure. The light shielding member 130 can be manufactured by press processing, for example.

The opening 133 is formed by the end portions of the inclined parts 132 on the side of the display pixel region 113. The opening 133 is positioned near the display pixel region 113, and corresponds to the display pixel region 113.

As such, the light shielding member 130 has the shape in which the opening end portions of the inclined parts 132 forming the opening 133 are disposed close to the display pixel region 113 of the liquid crystal display element 111, the inclined parts 132 are gradually separated from the liquid crystal display element 111, and the frame part 131 is disposed at the position where the frame part 131 is separated as much as possible from the liquid crystal display element 111 with the convex portions 121.

Since the opening end portions of the inclined parts 132 are disposed close to the liquid crystal display element 111, the light shielding member 130 is not easily influenced by disparity caused by the incident angle of the illumination light L1. Therefore, it is possible to prevent a blur at the outer peripheral portion of a display image, which may be caused by a leak of the illumination light L1.

Since the portions other than the opening end portions of the inclined parts 132 in the light shielding member 130 are separated from the liquid crystal display element 111, the heat generated by the irradiation of the illumination light L1 onto the light shielding member 130 is not easily transferred to the liquid crystal display element 111. Furthermore, since the light shielding member 130 is fixed to the heat sink 120, the heat generated by the light shielding member 130 can be efficiently transferred to the heat sink 120.

Therefore, according to the display device 100, the above-described shape of the light shielding member 130 can prevent the influence of disparity caused by the incident angle of the illumination angle L1 and the transfer of heat generated by the light shielding member 130 to the liquid crystal display element 111. Thus, the heat generated by the light shielding member 130 can be efficiently transferred to the heat sink 120.

When the illumination light L1 is irradiated onto the liquid crystal display element 111, the illumination light L1 irradiated onto the display pixel region 113 is optically modulated for each pixel in the display pixel region 113, and becomes the image light L2. The regions other than the display pixel region 113 are shielded from the illumination light L1 by the light shielding member 130.

Second Embodiment

Figure 4:
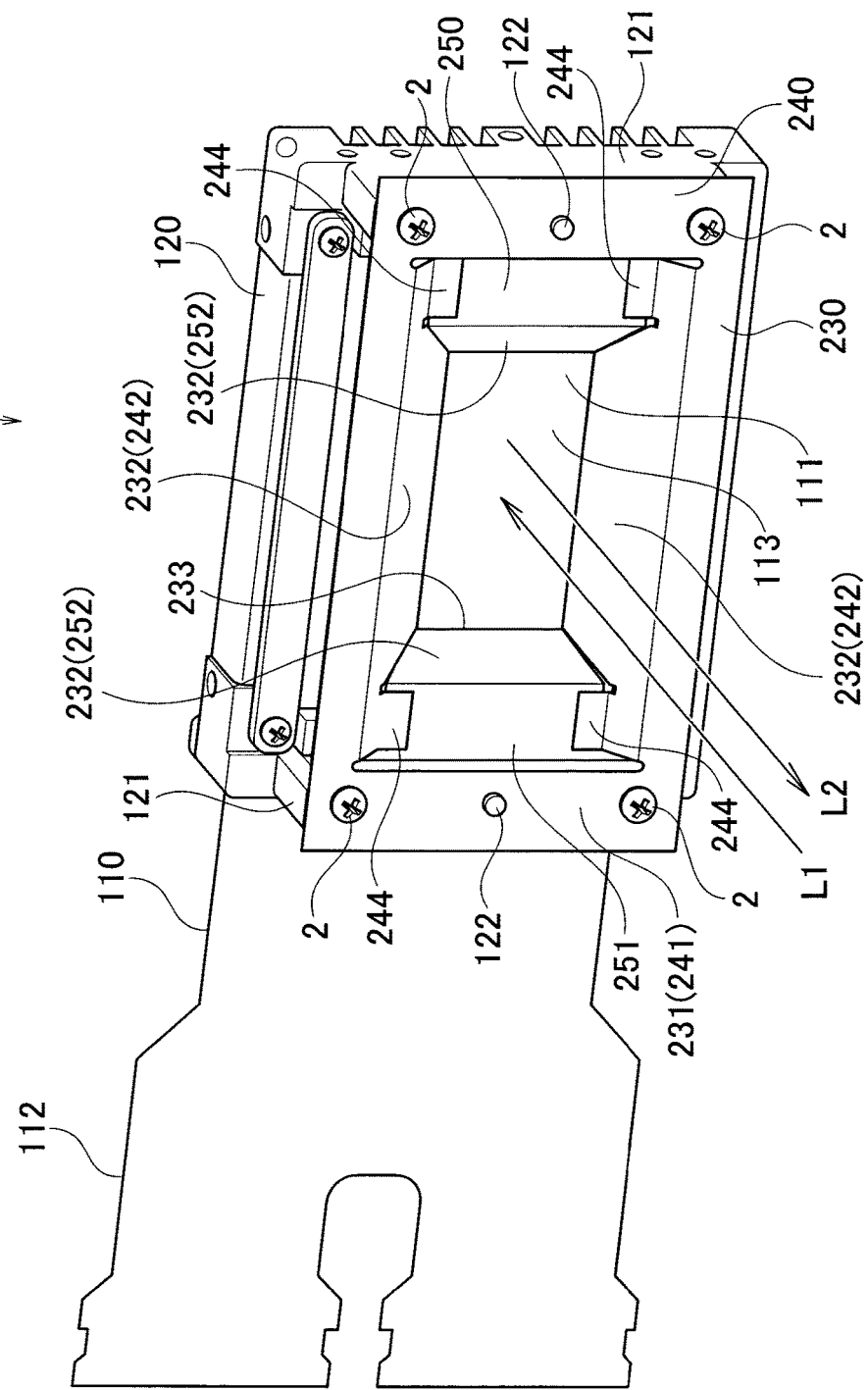
FIG. 4 is a perspective view illustrating a display device according to a second embodiment.
Figure 5:
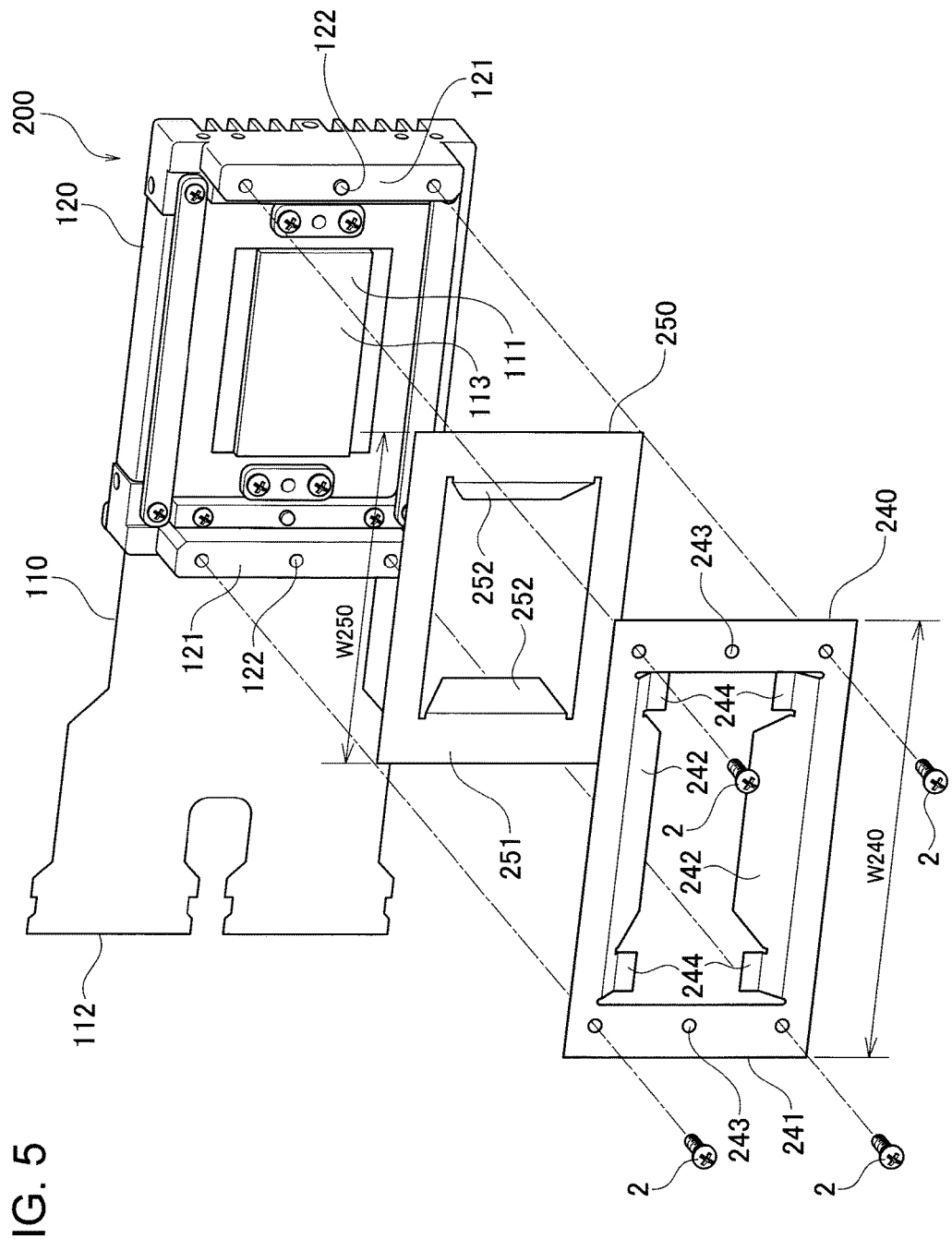
FIG. 5 is an exploded view of the display device according to a second embodiment.
Figure 6:
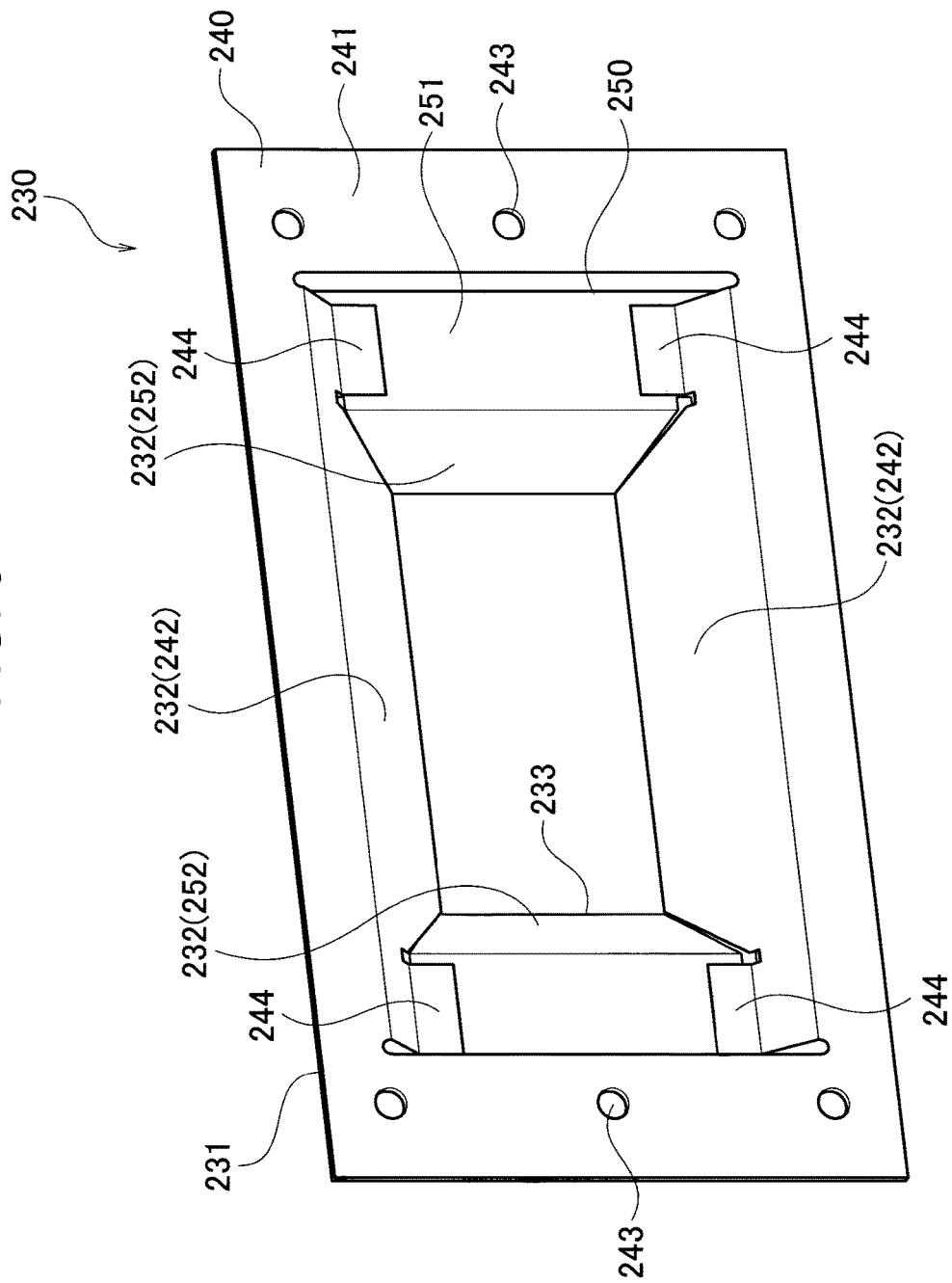
FIG. 6 is a perspective view illustrating a light shielding member of the display device according to a second embodiment.

Referring to FIGS. 4 to 6, a configuration example of a display device 200 according to a second embodiment will be described. In the following descriptions, a reflective liquid crystal display device will be exemplified as the display device 200. FIG. 4 illustrates the display device 200 when seen from a side of a display pixel region 113, and corresponds to FIG. 1. FIG. 5 illustrates components of the display device 200 when the display device 200 is disassembled, and corresponds to FIG. 2. FIG. 6 illustrates a light shielding member 230 of the display device 200.

As illustrated in FIG. 4 or 5, the display device 200 according to a second embodiment includes the light shielding member 230 instead of the light shielding member 130. In order to promote understandings of the descriptions, the same components as those of the display device 100 according to a first embodiment are represented by the same reference numerals.

The display device 200 includes the liquid crystal display unit 110, the heat sink 120, and the light shielding member 230. The liquid crystal display element 111 of the liquid crystal display unit 110 is positioned and fixed to the heat sink 120. As the liquid crystal display element 111 is driven through the flexible wiring plate 112 from outside, illumination light L1 irradiated onto the display pixel region 113 is optically modulated and reflected for each pixel, and becomes image light L2.

The light shielding member 230 shields regions other than the display pixel region 113 of the liquid crystal display element 111. Accordingly, the illumination light L1 is irradiated onto the display pixel region 113 of the liquid crystal display element 111, and the regions other than the display pixel region 113 are shielded from the illumination light L1 by the light shielding member 230. In order to prevent a generation of unnecessary light by reflection of the illumination light L1, a surface treatment such as coating may be performed such that the light shielding member 230 has a black surface.

The light shielding member 230 includes light shielding members 240 and 250. The light shielding member 130 according to a first embodiment is formed of one member, but the light shielding member 230 according to a second embodiment is formed of a plurality of members. As the material of the light shielding members 240 and 250, a metal plate made of stainless steel (for example, SUS304 (material mark)) may be used.

The light shielding member 240 includes a frame part 241 and two inclined parts 242. The inclined parts 242 are disposed in the vertical direction corresponding to the top-to-bottom direction in FIGS. 4 to 6. The frame part 241 includes positioning holes 243 formed therein. The light shielding member 250 includes a frame part 251 and two inclined parts 252. As illustrated in FIG. 5, the width W250 of the light shielding member 250 is set to a smaller value than the width W240 of the light shielding member 240, such that the frame part 251 does not block the positioning holes 243. The inclined parts 252 are disposed in the horizontal direction corresponding to the left-to-right direction in FIGS. 4 to 6.

The light shielding member 240 including the frame part 241 and the inclined parts 242 bent at a predetermined angle with respect to the frame part 241 can be formed through a process of cutting a metal plate for the light shielding member 240 into a predetermined shape and bending the cut metal plate at predetermined positions. Furthermore, the light shielding member 250 including the frame part 251 and the inclined parts 252 bent at a predetermined angle with respect to the frame part 251 can be formed through a process of cutting a metal plate for the light shielding member 250 into a predetermined shape and bending the cut metal plate at predetermined positions. Each of the inclined parts 242 and 252 are formed by bending the metal plate at a predetermined position, and correspond to a portion from the predetermined position to an end portion of the inclined part at the display pixel region 113.

As illustrated in FIG. 6, the light shielding member 240 may include joint parts 244 which are joined to the frame part 251 of the light shielding member 250. With the inclined parts 242 and 252 aligned with each other, the joint parts 244 and the frame part 251 are joined to each other through spot welding or the like, and the boundary portion between the inclined parts 242 and 252 is joined through welding or the like. When the joint parts 244 are not formed, the boundary portion between the inclined parts 242 and 252 is joined through welding or the like, with the inclined parts 242 and 252 aligned with each other.

In the display device 200 according to a second embodiment, the frame part 231 of the light shielding member 230 includes the frame parts 241 and 251, and the inclined part 232 of the light shielding member 230 includes the inclined parts 242 and 252. The frame part 231 is disposed outside the display pixel region 113 of the liquid crystal display element 111. The frame part 231 (specifically the frame part 241) is fixed to the convex portions 121 of the heat sink 120. The surfaces of the frame parts 241 and 251 are parallel to the surface of the display pixel region 113. However, the present embodiment is not limited to the structure in which the surfaces of the frame parts 241 and 251 are parallel to the surface of the display pixel region 113.

The height of the convex portion 121 is designed in such a manner that the frame part 231 is isolated from the liquid crystal display element 111. Accordingly, heat generated by the light shielding member 230 is not easily transferred to the liquid crystal display element 111.

The two inclined parts 242 and the two inclined parts 252 are formed in a trapezoidal shape. The inclined parts 242 and 252 are inclined from the frame parts 241 and 251 toward the outer peripheral portions of the display pixel region 113. The opening 233 is formed by end portions of the inclined parts 232 on the side of the display pixel region 113. The opening 233 is positioned adjacent to the display pixel region 113, and corresponds to the display pixel region 113.

When the positioning holes 243 and the positioning pins 122 of the heat sink 120 are fitted to each other such that the light shielding member 230 is fastened to the convex portions 121 through the screws 2, the light shielding member 130 is positioned and fixed to the heat sink 120. As the liquid crystal display element 111, the light shielding member 230, and the heat sink 120 are aligned with high precision, the opening 233 and the display pixel region 113 can be aligned with high precision.

As such, the light shielding member 230 has the shape in which the opening end portions of the inclined parts 232 forming the opening 233 are disposed adjacent to the display pixel region 113, the inclined parts 232 are gradually separated from the liquid crystal display element 111, and the frame part 231 is disposed at the position where the frame part 131 is separated as much as possible from the liquid crystal display element 111 by the convex portions 121.

Since the light shielding member 230 has the shape in which the opening end portions of the inclined parts 232 are adjacent to the liquid crystal display element 111, the light shielding member 130 is not easily influenced by disparity caused by the incident angle of the illumination light L1. Therefore, it is possible to prevent the outer peripheral portion of a display image from blurring, which may be caused by a leak of the illumination light L1.

Since the portions other than the opening end portions of the inclined parts 232 in the light shielding member 230 are separated from the liquid crystal display element 111, the heat generated by the irradiation of the illumination light L1 onto the light shielding member 230 is not easily transferred to the liquid crystal display element 111. Furthermore, since the light shielding member 230 is fixed to the heat sink 120, the heat generated by the light shielding member 230 can be efficiently transferred to the heat sink 120.

Therefore, according to the display device 200, the above-described shape of the light shielding member 230 can prevent the influence of disparity caused by the incident angle of the illumination angle L1 and the transfer of the heat generated by the light shielding member 230 to the liquid crystal display element 111. Thus, the heat generated by the light shielding member 230 can be efficiently transferred to the heat sink 120.

Figure 7:
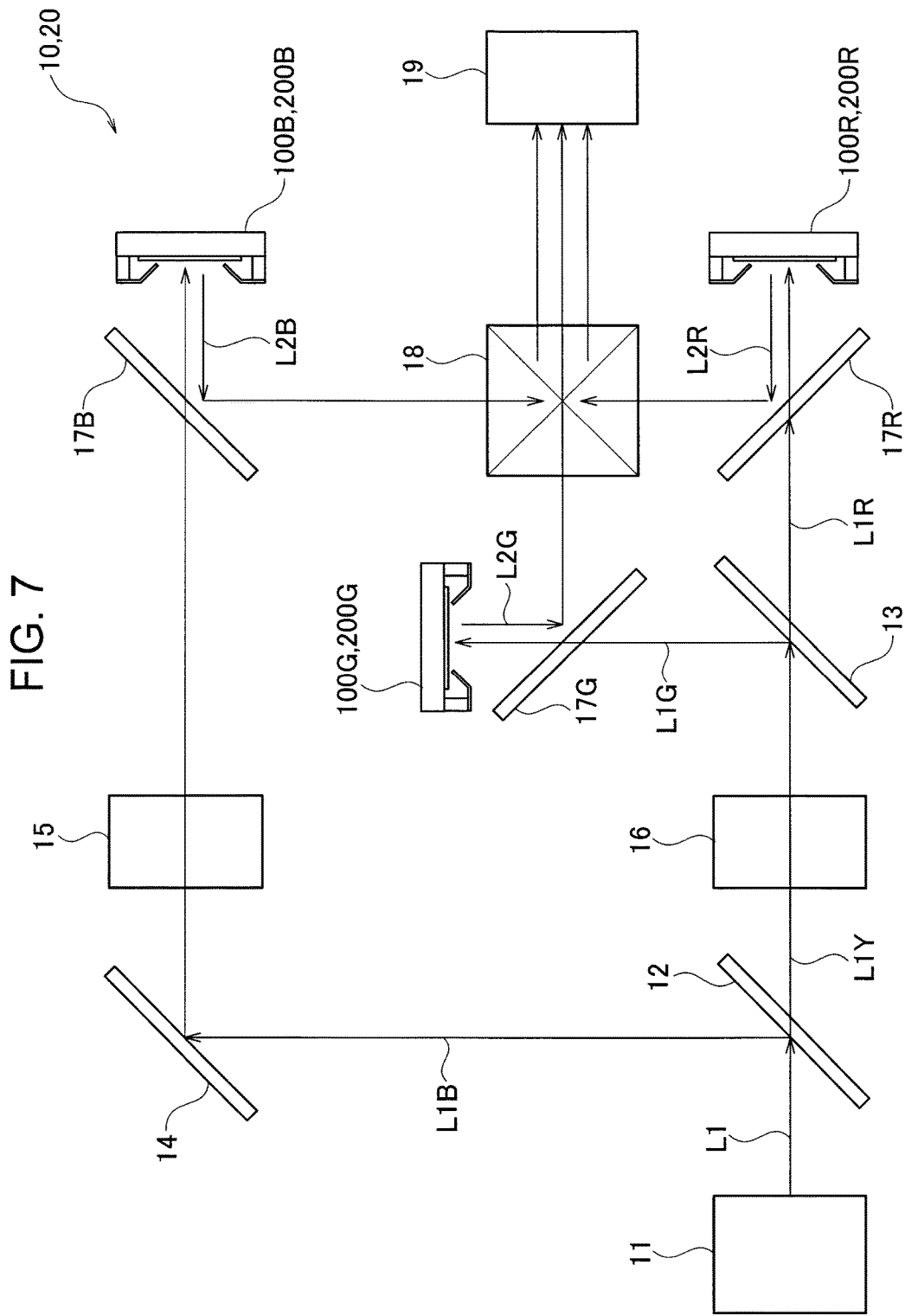
FIG. 7 is a configuration diagram illustrating a display apparatus including the display device according to first or second embodiment.

Referring to FIG. 7, a configuration example of a display apparatus 10 including the display device 100 or a display apparatus 20 including the display device 200 will be described. The display apparatus 10 includes a light source 11, dichroic mirrors 12 and 13, a reflecting mirror 14, light uniformizing optical systems 15 and 16, polarized beam filters 17R, 17G, and 17B, a combination optical system 18, a projection lens 19, and three display devices 100. In order to distinguish the three display devices 100 from each other, a display device for generating a red image is represented by 100R, a display device for generating a green image is represented by 100G, and a display device for generating a blue image is represented by 100B.

The display apparatus 20 includes display devices 200 instead of the display devices 100. In order to distinguish the three display devices 200 from each other, a display device for generating a red image is represented by 200R, a display device for generating a green image is represented by 200G, and a display device for generating a blue image is represented by 200B. Since the display apparatus 10 and the display apparatus 20 include the same components except the display devices 100 and 200, the components will be collectively described.

Illumination light L1 emitted from the light source 11 is irradiated onto the dichroic mirror 12. The dichroic mirror 12 reflects a blue component of the illumination light L1 as blue illumination light L1B. The dichroic mirror 12 transmits a yellow component including red and green components of the illumination light L1, as yellow illumination light L1Y.

The blue illumination light L1B is reflected by the reflecting mirror 14, and incident on the light uniformizing optical system 15. The light uniformizing optical system 15 uniformizes illumination distribution of the blue illumination light L1B, and optimizes a polarization state. The light uniformizing optical system 15 may include an integrator or light pipe and a polarizing plate or polarization conversion system (PCS). The integrator and the light pipe uniformize the illumination distribution of the blue illumination light L1B. The polarizing plate and the PCS optimize the polarization state of the blue illumination light L1B. The light uniformizing optical system 15 turns the blue illumination line L1B into p-polarized light.

The blue illumination light L1B emitted from the light uniformizing optical system 15 is irradiated on the polarized beam filter 17B. For example, the polarized beam filter 17B transmits p-polarized light, and reflects s-polarized light. The p-polarized blue illumination light L1B is transmitted through the polarized beam filter 17B, and is irradiated onto the display device 100B or 200B. The display device 100B or 200B optically modulates the blue illumination light L1B to s-polarized blue image light L2B. The blue image light L2B is reflected by the polarized beam filter 17B, and incident on the combination optical system 18.

The yellow illumination light L1Y is incident on the light uniformizing optical system 16. The light uniformizing optical system 16 uniformizes the illumination distribution of the yellow illumination light L1Y, and optimizes the polarization state. The light uniformizing optical system 16 may have an integrator or light pipe and a polarizing plate or PCS. The integrator and the light pipe uniformize the illumination distribution of the yellow illumination light L1Y. The polarizing plate and the PCS optimize the polarization state of the yellow illumination light L1Y. The light uniformizing optical system 16 turns the yellow illumination light L1Y into p-polarized light.

The yellow illumination light L1Y emitted from the light uniformizing optical system 16 is irradiated on the dichroic mirror 13. The dichroic mirror 13 reflects the green component of the yellow illumination light L1Y as green illumination light L1G. The dichroic mirror 13 reflects the red component of the yellow illumination light L1Y as red illumination light L1R.

The green illumination light L1G is irradiated onto the polarized beam filter 17G. The polarized beam filter 17G transmits p-polarized light, and reflects s-polarized light. The green illumination light L1G which is p-polarized light is transmitted through the polarized beam filter 17G, and irradiated onto the display device 100B or 200B. The display device 100B or 200B optically modulates the green illumination light L1G to s-polarized green image light L2G. The green image light L2G is reflected by the polarized beam filter 17G, and incident on the combination optical system 18.

The red illumination light L1R is irradiated onto the polarized beam filter 17R. The polarized beam filter 17B transmits p-polarized light, and reflects s-polarized light. The red illumination light L1R which is p-polarized light is transmitted through the polarized beam filter 17R, and irradiated onto the display device 100B or 200B. The display device 100R or 200R optically modulates the red illumination light L1R to s-polarized red image light L2R. The red image light L2R is reflected by the polarized beam filter 17R, and incident on the combination optical system 18.

The combination optical system 18 combines the red image light L2R, the green image light L2G, and the blue image light L2B. The projection lens 19 enlarges and projects the red image light L2R, the green image light L2G, and the blue image light L2B, which are combined by the combination optical system 18, as a full-color image onto a screen or the like.

Figure 8:
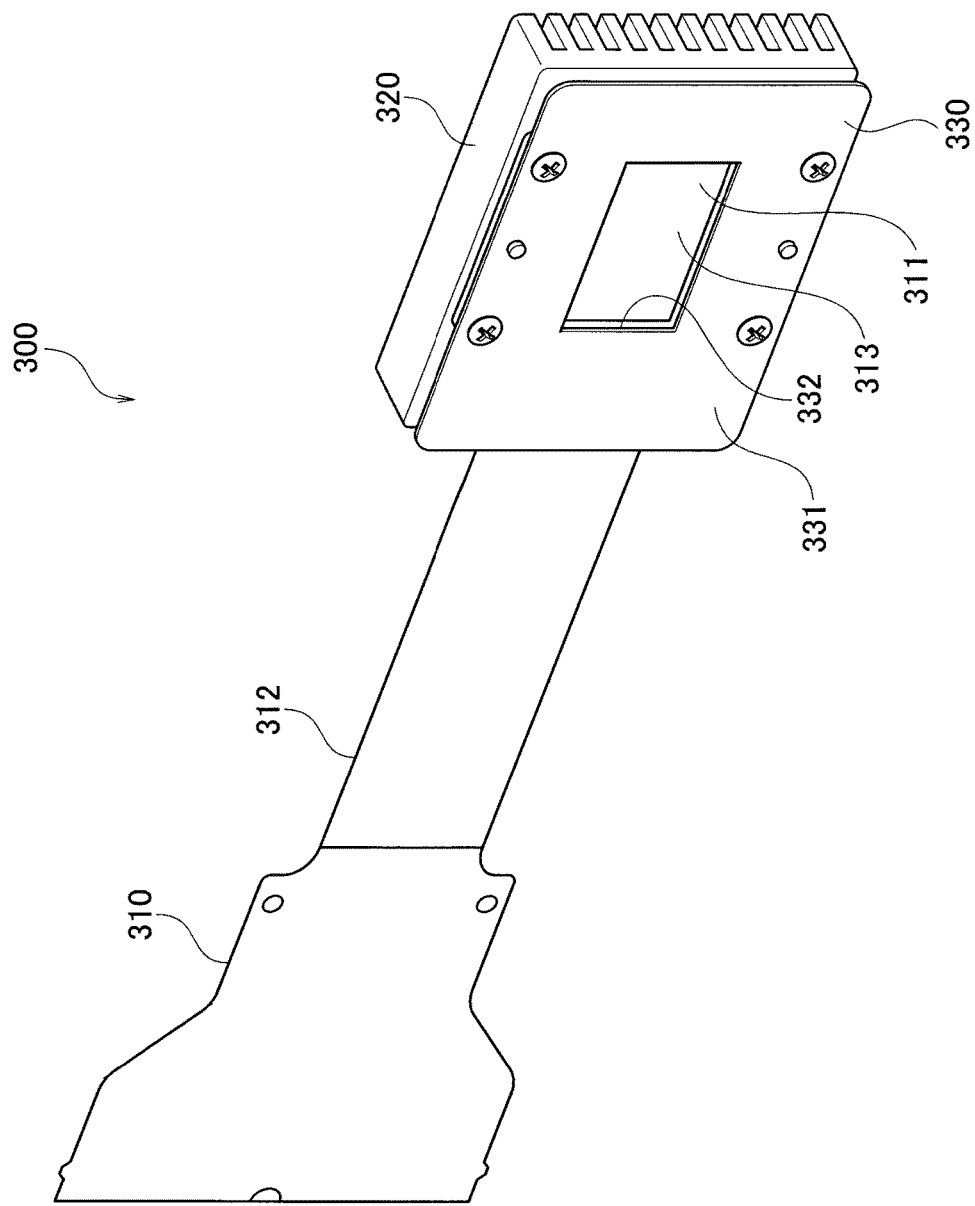
FIG. 8 is a perspective view illustrating a display device according to a comparative example.

Referring to FIGS. 8 to 11, the relation between illumination light and a display device 300 according to a comparative example will be described. As illustrated in FIG. 8, the display device 300 includes a liquid crystal display unit 310, a heat sink 320, and a light shielding member 330. The liquid crystal display unit 310 includes a liquid crystal display element 311 and a flexible wiring plate 312.

The light shielding member 330 includes a frame part 331 and an opening 332. The frame part 331 is fixed to the heat sink 320. The opening 332 is formed in a shape corresponding to the display pixel region 313 of the liquid crystal display element 311.

Figure 9A:
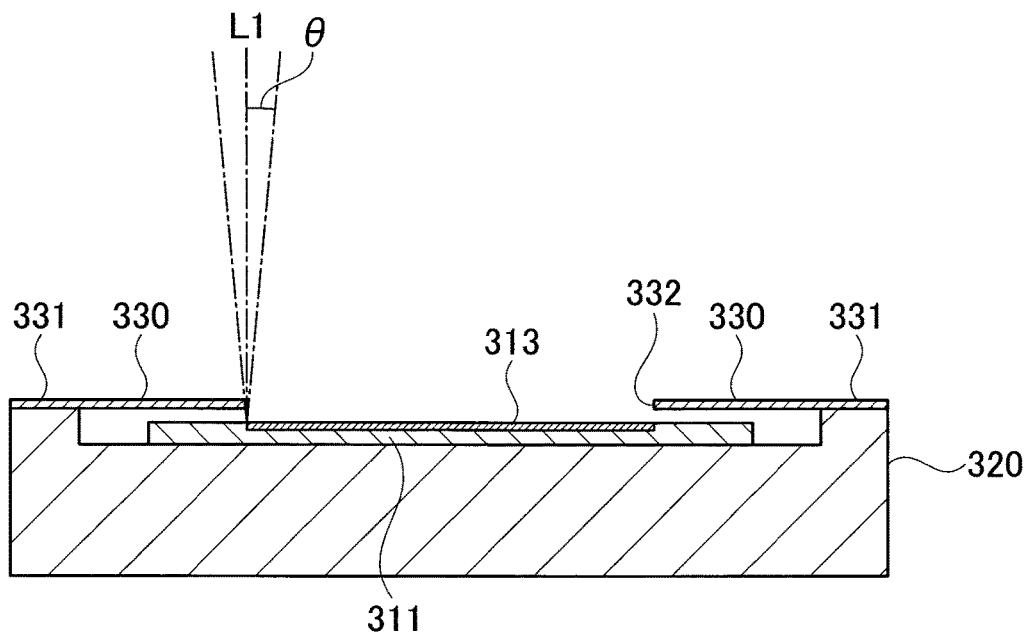
FIG. 9A is a cross-sectional view for illustrating the relation between illumination light and a light shielding member in a display device according to a first comparative example in which the light shielding member is disposed adjacent to a display pixel region of a liquid crystal display element.

FIG. 9A corresponding to a first comparative example illustrates that illumination light L1 is irradiated onto the liquid crystal display element 311, with the light shielding member 330 disposed adjacent to the display pixel region 313 of the liquid crystal display element 311. When the light shielding member 330 is disposed adjacent to the display pixel region 313, it is possible to prevent an influence of disparity caused by an incident angle θ of the illumination light L1. Therefore, it is possible to prevent the outer peripheral portion of a display image from blurring, which may be caused by a leak of the illumination light L1.

However, when the light shielding member 330 is disposed adjacent to the display pixel region 313, heat generated by the irradiation of high-energy illumination light L1 onto the light shielding member 330 is easily transferred to the liquid crystal display element 311. Accordingly, the liquid crystal display element 311 may be locally heated to degrade the display stability.

Figure 9B:
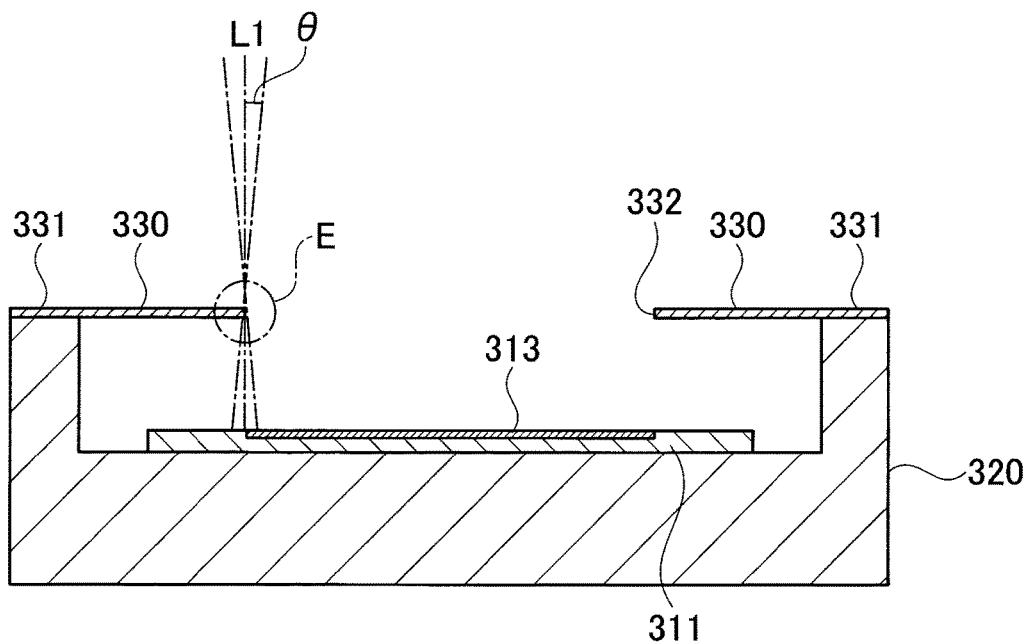
FIG. 9B is a cross-sectional view for illustrating the relation between illumination light and a light shielding member in a display device according to a second comparative example in which the light shielding member is separated from a display pixel region of a liquid crystal display element.

FIG. 9B corresponding to a second comparative example illustrates that the illumination light L1 is irradiated onto the liquid crystal display element 311, with the light shielding member 330 separated from the display pixel region 313 of the liquid crystal display element 311. When the light shielding member 330 is separated from the display pixel region 313, heat generated by the irradiation of high-energy illumination light L1 onto the light shielding member 330 is not easily transferred to the liquid crystal display element 311. Accordingly, it is possible to prevent a temperature rise of the liquid crystal display element 311, which may be caused by the heat of the light shielding member 330.

However, when the light shielding member 330 is separated from the display pixel region 313, the display pixel region 313 is easily influenced by disparity caused by an incident angle θ of the illumination light L1. Accordingly, since the shielding precision of the light shielding member 330 at the outer peripheral portion of the display pixel region 313 is degraded, the outer peripheral portion of an image may be blurred.

Figure 10:
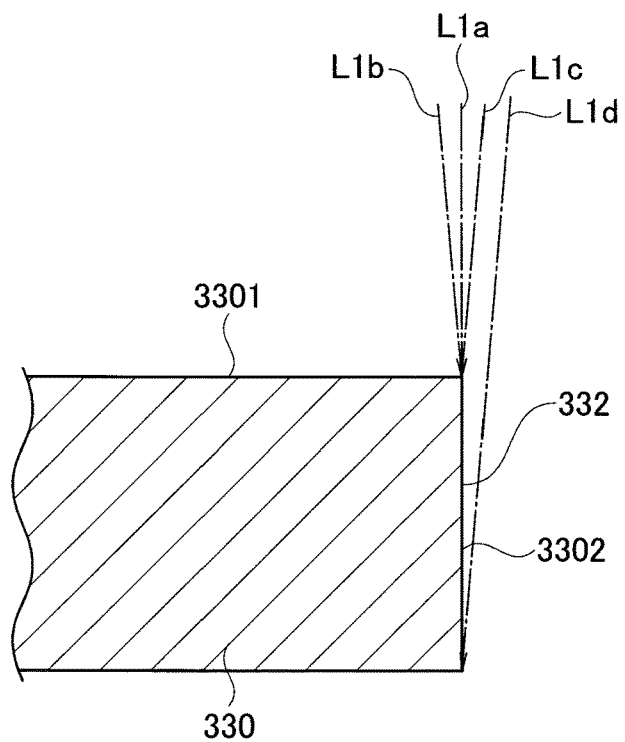
FIG. 10 is an expanded cross-sectional view for illustrating the relation between the illumination light and the light shielding member in the display device according to a second comparative example.
Figure 11:
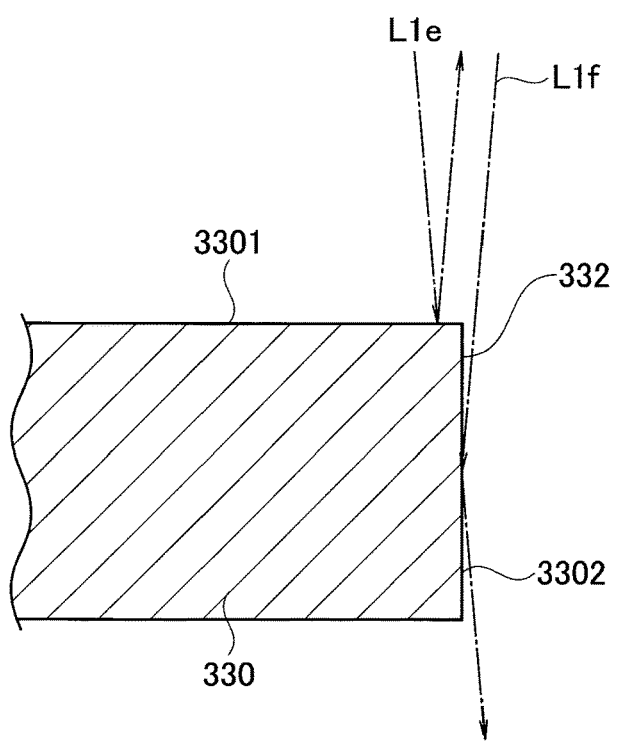
FIG. 11 is an expanded cross-sectional view for illustrating the relation between the illumination light and the light shielding member in the display device according to a second comparative example.

FIGS. 10 and 11 are expanded views of an opening end portion of the light shielding member 330 in region E of FIG. 9B. As illustrated in FIG. 10, illumination light L1a incident in the vertical direction with respect to the display pixel region 313 and illumination light L1b incident toward the inside from the outside of the opening 332 are blocked by the top surface 3301 of the light shielding member 330. Moreover, illumination lights L1c and L1d incident toward the outside from the inside of the opening 332 are blocked by the top surface 3301 or the end surface 3302 of the light shielding member 330.

As illustrated in FIG. 11, a part of the illumination light L1e irradiated onto the top surface 3301 of the light shielding member 330 is reflected on a light path and becomes stray light, thereby degrading the quality of a display image. Furthermore, a part of illumination light L1f irradiated onto the end surface 3302 of the light shielding member 330 is reflected as stray light and incident on the display pixel region 313, thereby degrading the quality of the display image.

When the light shielding member 330 is formed through press processing, burrs may be formed at an opening end portion of the light shielding member 330, and shear droop may occur on the end surface 3302. When the light shielding member 330 is formed by laser processing, minute irregularities may be formed on the end surface 3302 of the light shielding member 330.

The illumination light L1 irradiated onto the light shielding member 330 is blocked or reflected by the top surface 3301 or the end surface 3302 of the light shielding member 330, depending on an incident angle or incident position. Therefore, the illumination light L1 irradiated onto the display pixel region 313 is easily influenced by the burrs of the opening end portion of the light shielding member 330 or the shear drop of the end surface 3302, thereby degrading the quality of a display image.

Figure 12:
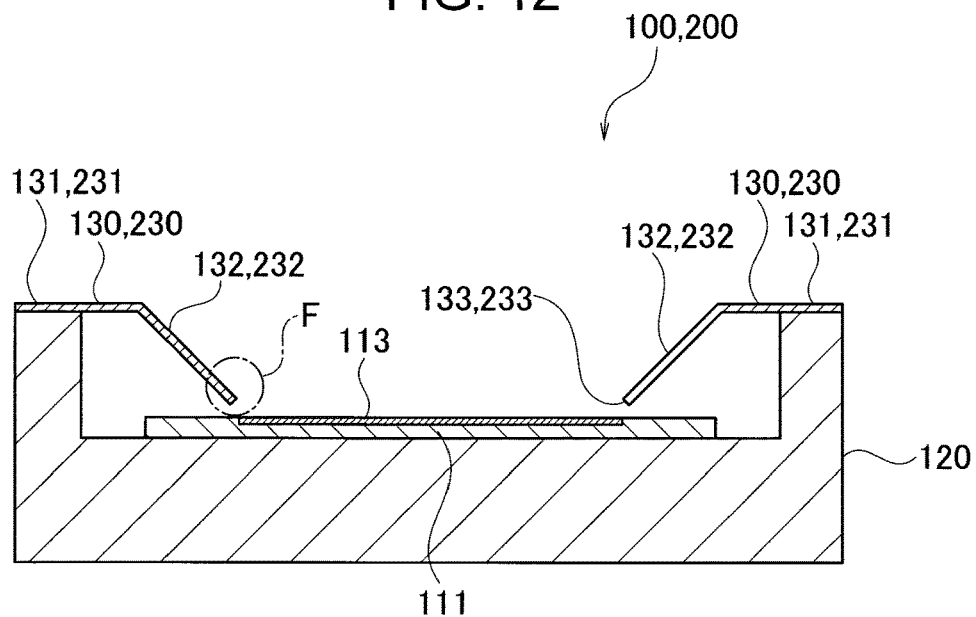
FIG. 12 is a cross-sectional view of the display device according to first and second embodiments.
Figure 13:
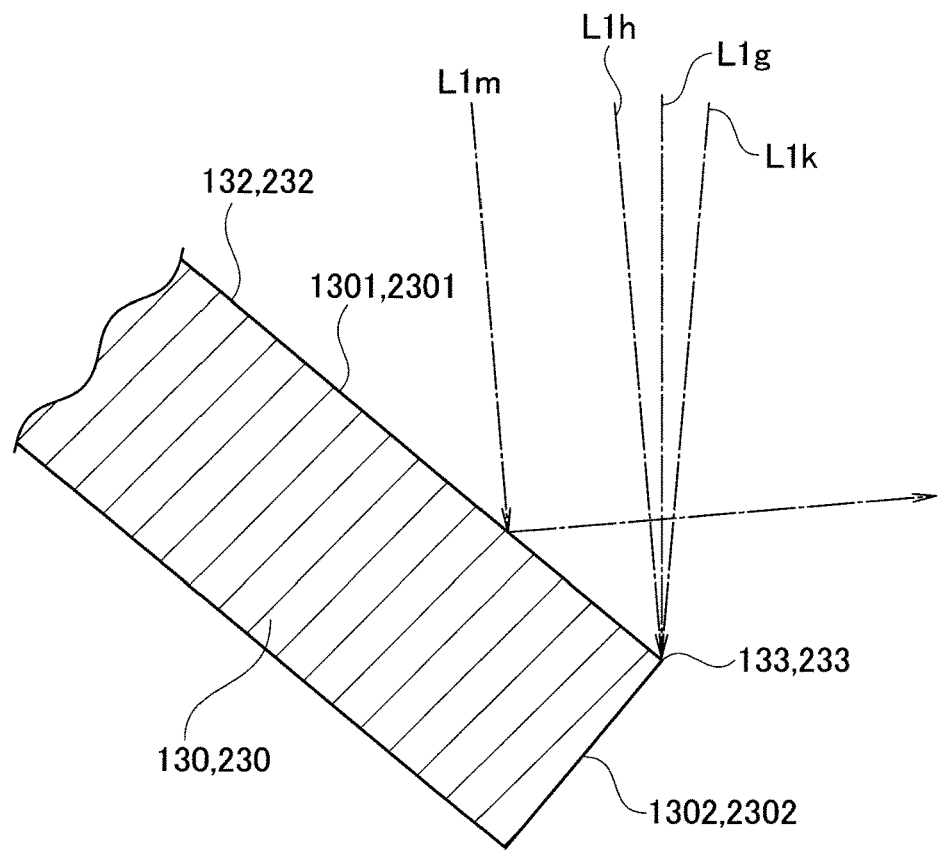
FIG. 13 is an expanded cross-sectional view for illustrating the relation between illumination light and the light shielding member in the display device according to first and second embodiments.

FIG. 12 schematically illustrates a cross-section of the display device 100 of FIG. 3. FIG. 13 is an expanded view of an opening end portion of the light shielding member 130 in a region F of FIG. 12. Since the opening end portion of the light shielding member 230 of the display device 200 also has the same shape as that illustrated in FIG. 13, the light shielding members 130 and 230 of the display devices 100 and 200 will be collectively described.

In the display devices 100 and 200 according to first and second embodiments, illumination light L1g incident in the vertical direction with respect to the display pixel region 113, illumination light L1h incident toward the inside from the outside of the opening 133 or 233, and illumination light L1k incident toward the outside from the inside of the opening 133 are blocked by the top surface 1301 of the light shielding member 130 and the top surface 2301 of the light shielding member 230. Furthermore, a part of illumination light L1m irradiated onto the top surface 1301 or 2301 is reflected in a direction different from a light path by the inclined part 132 or 232.

Therefore, in the display devices 100 and 200 according to first and second embodiments, the light shielding member 130 or 230 can prevent an influence of disparity caused by the incident angle θ of the illumination light L1, because the opening end portion of the inclined part 132 or 232 is disposed adjacent to the liquid crystal display element 111 and the other portions are separated from the liquid crystal display element 111. In addition, the display devices 100 and 200 according to first and second embodiments can prevent a transfer of heat generated by the light shielding member 130 or 230 to the liquid crystal display element 111, and efficiently transfer the heat generated by the light shielding member 130 or 230 to the heat sink 120.

In the display devices 100 and 200 according to first and second embodiments, the illumination light L1 irradiated onto the light shielding member 130 or 230 is blocked by the top surface 1301 of the light shielding member 130 or the top surface 2301 of the light shielding member 230, regardless of the thickness, incident angle, or incident position of the light shielding member 130 or 230. Therefore, since the illumination light L1 irradiated onto the display pixel region 113 is not easily influenced by shear droop on the end surface 1302 of the light shielding member 130 or the end surface 2302 of the light shielding member 230, the display device 100 or 200 can prevent degradation in quality of a display image.

Furthermore, since the illumination light L1 irradiated on the light shielding member 130 or 230 can be reflected in a direction different from the light path by the inclined part 132 or 232, the display devices 100 and 200 according to first and second embodiments can prevent degradation in the quality of a display image.

The present disclosure is not limited to first and second embodiments, but can be modified in various ways without departing from the scope of the present invention.

What is claimed is:

1. A display device, comprising:
    a liquid crystal display element including a display pixel region which includes a plurality of pixels for displaying an image and optically modulates illumination light for each of the pixels;
    a light shielding member configured to block the illumination light irradiated onto regions other than the display pixel region of the liquid crystal display element; and
    a heat sink to which the liquid crystal display element and the light shielding member are fixed,
    wherein the light shielding member comprises:
    a frame part disposed outside the display pixel region, the frame part being located at a position away from a surface of the liquid crystal display element in a direction orthogonal to the surface of the liquid crystal display element;
    an inclined part inclined from the frame part toward an outer peripheral portion of the display pixel region; and
    an opening formed by an end portion of the inclined part on a side of the display pixel region, and formed in a shape corresponding to the display pixel region, wherein only the end portion of the inclined part is disposed adjacent the surface of the liquid crystal display element, the inclined part being inclined outwardly with respect to, and extending away from, the display pixel region and the surface of the liquid crystal display element.

2. The display device according to claim 1, wherein
    the light shielding member comprises first and second light shielding members,
    the first light shielding member comprising a first pair of inclined parts disposed in a first direction, and
    the second light shielding member comprising a second pair of inclined parts disposed in a second direction orthogonal to the first direction.

3. The display device according to claim 2, wherein
    the first and second light shielding members each have a shape in which a metal plate is bent at a predetermined position, the metal plate having a predetermined shape, and
    the first and second pairs of inclined parts correspond to portions from the predetermined position in the metal plate to the end portion on the side of the display pixel region.

4. A display apparatus, comprising:
    a light source configured to emit illumination light; and
    a display device onto which the illumination light is irradiated,
    wherein the display device comprises:
    a liquid crystal display element including a display pixel region which includes a plurality of pixels for displaying an image and optically modulates the illumination light for each of the pixels;
    a light shielding member configured to block the illumination light irradiated onto regions other than the display pixel region of the liquid crystal display element; and
    a heat sink to which the liquid crystal display element and the light shielding member are fixed,
    wherein the light shielding member comprises:
    a frame part disposed outside the display pixel region, the frame part being located at a position away from a surface of the liquid crystal display element in a direction orthogonal to the surface of the liquid crystal display element;
    an inclined part inclined from the frame part toward an outer peripheral portion of the display pixel region; and
    an opening formed by an end portion of the inclined part on a side of the display pixel region, and formed in a shape corresponding to the display pixel region, wherein only the end portion of the inclined part is disposed adjacent the surface of the liquid crystal display element, the inclined part being inclined outwardly with respect to, and extending away from, the display pixel region and the surface of the liquid crystal display element.

* * * * *